(12) United States Patent
Wang

(10) Patent No.: US 10,573,671 B2
(45) Date of Patent: Feb. 25, 2020

(54) FLEXIBLE ORGANIC LIGHT EMITTING DIODE DISPLAY WITH DIRECTIONAL CRYSTALLIZED CHANNEL AND MANUFACTURING METHOD THEREOF

(71) Applicant: Wuhan China Star Optoelectronics Technology Co., Ltd., Wuhan, Hubei (CN)

(72) Inventor: Wei Wang, Wuhan (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 30 days.

(21) Appl. No.: 15/568,690

(22) PCT Filed: Apr. 25, 2017

(86) PCT No.: PCT/CN2017/081834
§ 371 (c)(1),
(2) Date: Oct. 23, 2017

(87) PCT Pub. No.: WO2018/176541
PCT Pub. Date: Oct. 4, 2018

(65) Prior Publication Data
US 2018/0301480 A1 Oct. 18, 2018

(30) Foreign Application Priority Data
Mar. 30, 2017 (CN) .......................... 2017 1 0203341

(51) Int. Cl.
*H01L 27/12* (2006.01)
*H01L 51/00* (2006.01)
(Continued)

(52) U.S. Cl.
CPC .... *H01L 27/1274* (2013.01); *H01L 21/02532* (2013.01); *H01L 21/02595* (2013.01);
(Continued)

(58) Field of Classification Search
CPC combination set(s) only.
See application file for complete search history.

(56) References Cited

U.S. PATENT DOCUMENTS 6,831,299 B2 * 12/2004 Koyama ........... H01L 29/78675
257/500
7,164,152 B2 * 1/2007 Im ........................ H01L 21/268
257/64
(Continued)

FOREIGN PATENT DOCUMENTS

CN  101179110 A  5/2008
CN  101517135 A  8/2009
(Continued)

*Primary Examiner* — Nduka E Ojeh
(74) *Attorney, Agent, or Firm* — Mark M. Friedman

(57) ABSTRACT

A flexible organic light emitting diode display and manufacturing method thereof are provided. The method includes: performing a first patterning process on an amorphous silicon film; performing a crystallization treatment on the amorphous silicon film which has been processed by the first patterning process to form an oriented crystalline polycrystalline silicon film; performing a second patterning process on the polycrystalline silicon film to form a channel; and sequentially forming a gate, a source, a drain, an OLED display layer, and a packaging layer over the channel.

9 Claims, 3 Drawing Sheets

(51) Int. Cl.
    *H01L 29/786*    (2006.01)
    *H01L 29/66*     (2006.01)
    *H01L 21/02*     (2006.01)
    *H01L 29/04*     (2006.01)
    *H01L 27/32*     (2006.01)
    *H01L 29/08*     (2006.01)
    *H01L 35/24*     (2006.01)

(52) U.S. Cl.
    CPC ...... *H01L 27/1218* (2013.01); *H01L 27/1222* (2013.01); *H01L 27/1262* (2013.01); *H01L 27/1285* (2013.01); *H01L 29/04* (2013.01); *H01L 29/66757* (2013.01); *H01L 29/78675* (2013.01); *H01L 51/0097* (2013.01); H01L 21/02675 (2013.01); H01L 21/02686 (2013.01); H01L 27/3244 (2013.01); H01L 27/3262 (2013.01); H01L 2227/323 (2013.01); H01L 2251/5338 (2013.01)

(56) References Cited

U.S. PATENT DOCUMENTS

| | | | |
|---|---|---|---|
| 7,262,821 B2* | 8/2007 | Tai | G02F 1/136277 257/72 |
| 2008/0030877 A1 | 2/2008 | Turk et al. | |
| 2009/0218577 A1* | 9/2009 | Im | H01L 21/02532 257/75 |
| 2015/0123098 A1* | 5/2015 | Kang | H01L 51/5253 257/40 |
| 2016/0197293 A1* | 7/2016 | Chen | H01L 21/02354 257/40 |

FOREIGN PATENT DOCUMENTS

| | | |
|---|---|---|
| WO | 2007/022302 A2 | 2/2007 |
| WO | 2013/030885 A1 | 3/2013 |

* cited by examiner

FLEXIBLE ORGANIC LIGHT EMITTING DIODE DISPLAY WITH DIRECTIONAL CRYSTALLIZED CHANNEL AND MANUFACTURING METHOD THEREOF

FIELD OF THE DISCLOSURE

The present disclosure relates to the field of display devices, and more particularly to a flexible organic light emitting diode display and manufacturing method thereof.

BACKGROUND

Recently, flexible display technology is mainly used in small and medium size products. In general, an LTPS-TFT back plane is used, where a low temperature poly-silicon (LTPS), which is crystallized by excimer laser annealing (ELA), serves as a channel layer of a thin film transistor (TFT). The electrical parameters (e.g., threshold voltage, subthreshold swing, mobility, etc.) of the TFT are strongly associated with a grain boundary density in the channel. To make an array substrate having good electrical uniformity, the LTPS film is required to have a very uniform grain size.

An LTPS film is constituted by many silicon grains, which inevitably have grain boundaries. Since an atomic binding force at a crystalline interface of the LTPS thin film is weak, an inter-granular fracture/deformation occurs at the grain boundary under a bending stress, so that electrical characteristics of the TFT are deteriorated and the device even fails.

Accordingly, it is necessary to provide a flexible organic light emitting diode display and manufacturing method thereof to solve the technical problems in the prior art.

SUMMARY OF THE DISCLOSURE

An object of the present disclosure is to provide a flexible organic light emitting diode display and manufacturing method thereof, by which a grain boundary density of an LTPS film along a lengthwise direction of a channel can be decreased.

In order to solve technical problems mentioned above, the present disclosure provides a manufacturing method of a flexible organic light emitting diode, including:
depositing an amorphous silicon film over a flexible substrate and performing a first patterning process on the amorphous silicon film;
excimer laser annealing the amorphous silicon film which has been processed by the first patterning process to form an oriented crystalline polycrystalline silicon film;
performing a second patterning process on the polycrystalline silicon film to form a channel;
sequentially forming a gate, a source, and a drain over the channel;
forming an OLED display layer on the source and the drain; and
forming a packaging layer on the OLED display layer;
wherein after performing the first patterning process on the amorphous silicon film, a plurality of sub-amorphous silicon films are formed, each of the sub-amorphous silicon films includes two sets of adjacent first sides and second sides, a length of the first side is less than a length of the second side; and
a lengthwise direction of the channel is parallel with the first side, and a widthwise direction of the channel is parallel with the second side.

In the manufacturing method of the flexible organic light emitting diode of the present disclosure, the polycrystalline silicon film is crystallized along an extension line of the first side.

In the manufacturing method of the flexible organic light emitting diode of the present disclosure, the polycrystalline silicon film includes a plurality of polysilicon grains, a lengthwise direction of the polysilicon grains is the same as the lengthwise direction of the channel, and a widthwise direction of the polysilicon grains is the same as the widthwise direction of the channel.

In the manufacturing method of the flexible organic light emitting diode of the present disclosure, the step of depositing the amorphous silicon film over the flexible substrate includes:
forming a barrier layer on the flexible substrate;
forming a buffer layer on the barrier layer; and
depositing the amorphous silicon film on the buffer layer.

In the manufacturing method of the flexible organic light emitting diode of the present disclosure, the step of sequentially forming the gate over the channel includes:
forming a gate insulator layer on the channel; and
forming a first metal layer on the gate insulator layer, and performing a patterning process on the first metal layer to form the gate.

The present disclosure provides a manufacturing method of a flexible organic light emitting diode, including:
depositing an amorphous silicon film over a flexible substrate and performing a first patterning process on the amorphous silicon film;
performing a crystallization treatment on the amorphous silicon film which has been processed by the first patterning process to form an oriented crystalline polycrystalline silicon film;
performing a second patterning process on the polycrystalline silicon film to form a channel;
sequentially forming a gate, a source, and a drain over the channel;
forming an OLED display layer on the source and the drain; and
forming a packaging layer on the OLED display layer.

In the manufacturing method of the flexible organic light emitting diode of the present disclosure, after performing the first patterning process on the amorphous silicon film, a plurality of sub-amorphous silicon films are formed, each of the sub-amorphous silicon films includes two sets of adjacent first sides and second sides, a length of the first side is less than a length of the second side; and
a lengthwise direction of the channel is parallel with the first side, and a widthwise direction of the channel is parallel with the second side.

In the manufacturing method of the flexible organic light emitting diode of the present disclosure, the polycrystalline silicon film is crystallized along an extension line of the first side.

In the manufacturing method of the flexible organic light emitting diode of the present disclosure, the polycrystalline silicon film includes a plurality of polysilicon grains, a lengthwise direction of the polysilicon grains is the same as the lengthwise direction of the channel, and a widthwise direction of the polysilicon grains is the same as the widthwise direction of the channel.

In the manufacturing method of the flexible organic light emitting diode of the present disclosure, the crystallization treatment is an excimer laser anneal treatment.

In the manufacturing method of the flexible organic light emitting diode of the present disclosure, the step of depositing the amorphous silicon film over the flexible substrate includes:

forming a barrier layer on the flexible substrate;
forming a buffer layer on the barrier layer; and
depositing the amorphous silicon film on the buffer layer.

In the manufacturing method of the flexible organic light emitting diode of the present disclosure, a material of the buffer layer includes $SiO_2$, $SiN_x$, or $Al_2O_3$.

In the manufacturing method of the flexible organic light emitting diode of the present disclosure, the step of sequentially forming the gate over the channel includes:

forming a gate insulator layer on the channel; and
forming a first metal layer on the gate insulator layer, and performing a patterning process on the first metal layer to form the gate.

The present disclosure also provides a flexible organic light emitting diode display, including:

a flexible substrate;
an active array layer located over the flexible substrate, where the active array layer includes an active layer for forming a channel, the channel is formed by performing a second patterning process on an oriented crystalline polycrystalline silicon film, the oriented crystalline polycrystalline silicon film is formed by performing a first patterning process on an amorphous silicon film and then by performing a crystallization treatment on the amorphous silicon film which has been processed by the first patterning process;
an OLED display layer located on the active array layer; and
a packaging layer located on the OLED display layer.

In the flexible organic light emitting diode display of the present disclosure, the amorphous silicon film, which has been processed by the first patterning process, includes a plurality of sub-amorphous silicon films, each of the sub-amorphous silicon films includes two sets of adjacent first sides and second sides, a length of the first side is less than a length of the second side; and a lengthwise direction of the channel is parallel with the first side, and a widthwise direction of the channel is parallel with the second side.

In the flexible organic light emitting diode display of the present disclosure, the polycrystalline silicon film includes a plurality of polysilicon grains, a lengthwise direction of the polysilicon grains is the same as the lengthwise direction of the channel, and a widthwise direction of the polysilicon grains is the same as the widthwise direction of the channel.

In the flexible organic light emitting diode display of the present disclosure, the crystallization treatment is an excimer laser anneal treatment.

In the flexible organic light emitting diode display and manufacturing method of the present disclosure, since the active layer is made by the oriented crystalline polycrystalline silicon film, the grain boundary density of the LTPS thin film along the TFT channel direction is low. Therefore, the TFT has better electrical properties, and an inter-granular fracture/deformation does not easily occur at a grain boundary under a bending stress, thereby increasing a reliability of the TFT and increasing a reliability of the flexible display device under bending stress.

DETAILED DESCRIPTION

Figure 1:
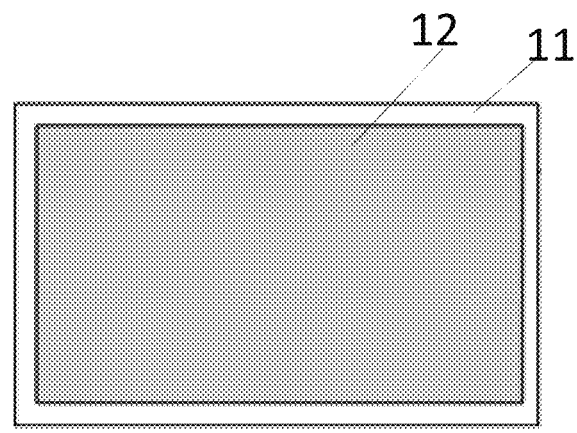
FIG. 1 is a schematic diagram of a first step of a manufacturing method of a flexible organic light emitting diode of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

FIG. 1 is a schematic diagram of a first step of a manufacturing method of a flexible organic light emitting diode of the present disclosure.

As shown in FIG. 1, the manufacturing method of a flexible organic light emitting diode of the present disclosure includes:

S101, an amorphous silicon film is deposited over a flexible substrate.

As shown in FIG. 1, a barrier layer, a buffer layer, and the amorphous silicon film 12 are sequentially deposited on the substrate 11.

S102, the amorphous silicon film has performed a first patterning process.

Figure 2:
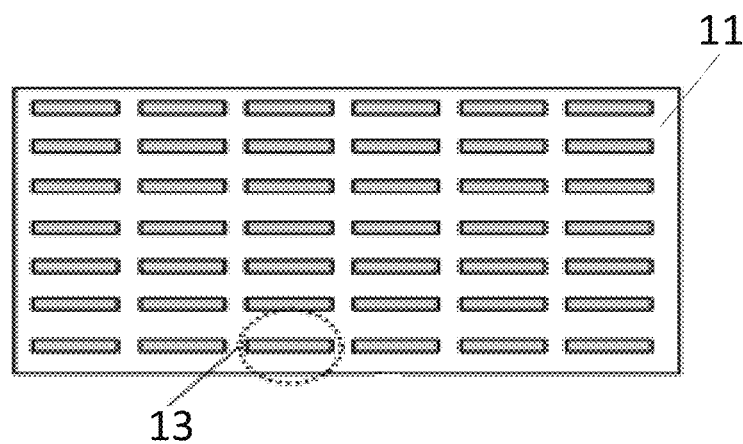
FIG. 2 is a schematic diagram of a second step of the manufacturing method of the flexible organic light emitting diode of the present disclosure.

As shown in FIG. 2, the amorphous silicon film 12 is patterned by a yellow light lithography process to obtain a plurality of sub-amorphous silicon films 13.

Figure 3:
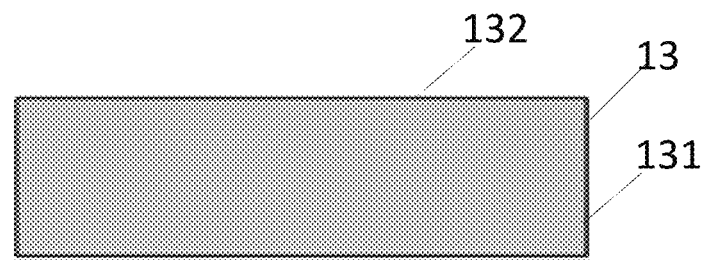
FIG. 3 is an enlarged structural diagram of a sub-amorphous silicon film in FIG. 2.

In one embodiment, the shape of the sub-amorphous silicon film 13 is rectangular. As shown in FIG. 3, the sub-amorphous silicon film 13 has two sets of adjacent first sides 131 (short side) and second sides 132 (long side). A length of the first side 131 is less than a length of the second side 132.

Figure 7:
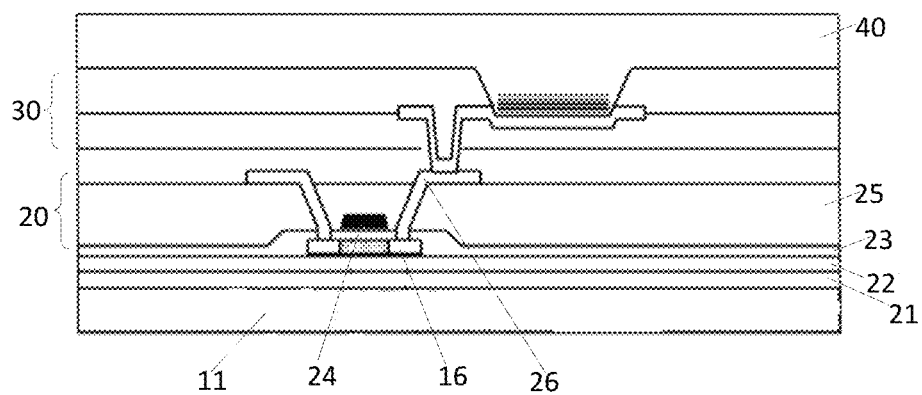
FIG. 7 is a structural diagram of the flexible organic light emitting diode display of the present disclosure.

In conjunction with FIG. 7, the step of depositing the amorphous silicon film on the flexible substrate includes:

S1021, a barrier layer is formed on the flexible substrate.

For example, the barrier layer 21 is formed on the flexible substrate 11. The barrier layer 21 is made of inorganic materials such as $SiO_2$, $SiN_x$, or $Al_2O_3$, and is used to isolate water molecules, to avoid thin film transistors being damaged by the water molecules on the air. The barrier layer 21 is fabricated by low temperature plasma enhanced chemical vapor deposition (PECVD) or atomic layer deposition (ALD).

S1022, a buffer layer is formed on the barrier layer.

The material of the buffer layer 22 is an inorganic material. The material of the buffer layer 22 may be $SiO_2$, $SiN_x$, or $Al_2O_3$. The preparation method of the buffer layer 22 is the same as the preparation method of the barrier layer 21.

S1023, the amorphous silicon film is deposited on the buffer layer.

S103, the amorphous silicon film which has been processed by the first patterning process has performed a crystallization treatment to form an oriented crystalline polycrystalline silicon film.

Figure 4:
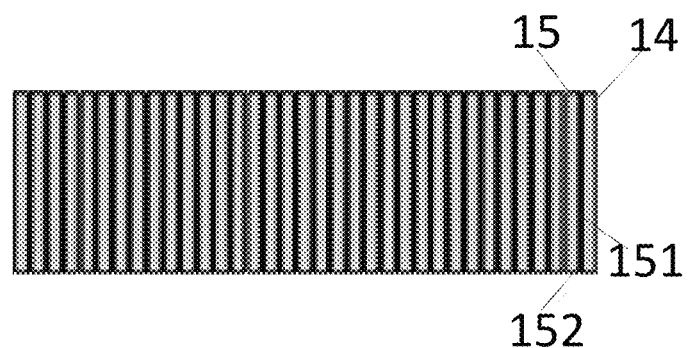
FIG. 4 is a schematic diagram of a third step of the manufacturing method of the flexible organic light emitting diode of the present disclosure.

As shown in FIG. 4, the plurality of sub-amorphous silicon films shown in FIG. 2 are subjected to the crystallization treatment, so that the oriented crystalline polycrystalline silicon film crystallized along the short side direction of the sub-amorphous silicon film is formed.

In one embodiment, the crystallization treatment is an excimer laser anneal treatment. Amorphous silicon film absorbs laser energy and melts into liquid, and then it is passed through a cooling-crystallization. Since the heat dissipation from the edge of the sub-amorphous silicon film 13 is relatively fast, the temperature at the edge is relatively low. Hence, the edge becomes a nucleation point of the polysilicon crystal. Polysilicon grains are crystallized from the edge (low temperature region) of the sub-amorphous silicon film 13 to a center (high temperature region) of the sub-amorphous silicon film 13 to form columnar polysilicon grains in the long side direction perpendicular to the sub-amorphous silicon film 13. Since a distance of the short side of the sub-amorphous silicon film is short and the temperature difference at the short side is large, it is easy to form the polysilicon grains grown in the direction of the short side.

That is, the polycrystalline silicon film 14 includes a plurality of polysilicon grains 15, which are arranged side by side and have a rectangular shape. The polysilicon grain 15 has a long side 151 and a short side 152. The direction of the long side is a lengthwise direction, and the direction of the short side is a widthwise direction.

S104, the polycrystalline silicon film has performed a second patterning process to form a channel.

Figure 5:
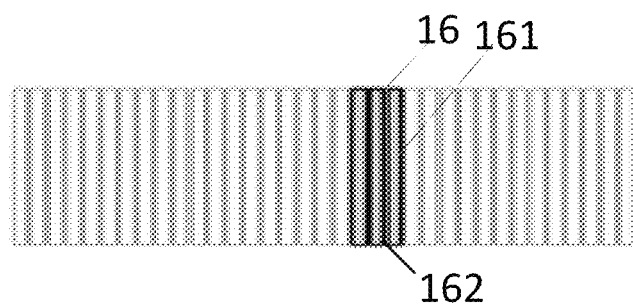
FIG. 5 is a schematic diagram of a fourth step of the manufacturing method of the flexible organic light emitting diode of the present disclosure.

As shown in FIG. 5, the lengthwise direction 161 of the channel 16 is the same as the lengthwise direction of the polysilicon grains 15, and the widthwise direction 162 of the channel 16 is the same as the widthwise direction of the polysilicon grains 15.

Furthermore, the lengthwise direction 161 of the channel 16 is parallel to the first side 131, and the widthwise direction 162 of the channel 16 is parallel to the second side 132.

Thus, the grain boundary density along the lengthwise direction of the channel of a thin film transistor is very low. An inter-granular fracture/deformation does not easily occur at the grain boundary under a bending stress, such that the thin film transistor has higher reliability and better electrical properties under the bending stress, thereby increasing the reliability of the flexible display device under the bending stress.

S105, a gate, a source, and a drain are sequentially formed over the channel to form the thin film transistor.

For example, a gate insulator layer, the gate, an interlayer insulation layer, and the source, and the drain are sequentially formed on the channel.

Figure 6:
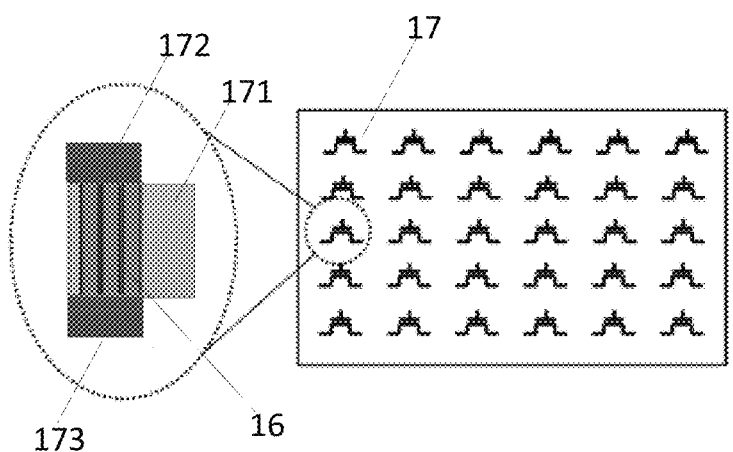
FIG. 6 is a structural diagram of a thin film transistor in the flexible organic light emitting diode display of the present disclosure.

As shown in FIG. 6, the thin film transistor includes the gate 171, the drain 172, and the source 173. The channel 16 is located between the source 173 and the drain 172.

The step of sequentially forming the gate on the channel in step S105 includes:

In conjunction with FIG. 6 and FIG. 7, S1051, the gate insulator layer 23 is formed on the channel 16.

S1052, a first metal layer 24 is formed on the gate insulator layer 23, and the first metal layer 24 is patterned to obtain the gate.

Furthermore, the above method may also include:

S1053, an interlayer insulation layer 25 is formed on the first metal layer 24.

S1054, a second metal layer 26 is formed on the interlayer insulation layer 25. The second metal layer 26 is patterned to obtain the source and the drain.

S106, an OLED display layer 30 is formed on the source and the drain.

S107, a packaging layer 40 is formed on the OLED display layer 30.

In the manufacturing method of the flexible organic light emitting diode of the present disclosure, since the active layer is made by the oriented crystalline polycrystalline silicon film, the grain boundary density of the LTPS thin film along the TFT channel direction is low. Therefore, the TFT has better electrical properties, and an inter-granular fracture/deformation does not easily occur at a grain boundary under a bending stress, thereby increasing a reliability of the TFT and increasing a reliability of the flexible display device under bending stress.

As shown in FIG. 7, the flexible organic light emitting diode display of the present disclosure includes the flexible substrate 11, the barrier layer 21, the buffer layer 22, an active array layer 20, the OLED display layer 30, and the packaging layer 40.

The barrier layer 21 is located on the flexible substrate 11. The active array layer 20 is located on the buffer layer 22. The material of the barrier layer 21 is an inorganic material, such as $SiO_2$, $SiN_x$, or $Al_2O_3$, and is used to isolate water molecules, to avoid thin film transistors being damaged by the water molecules on the air. The barrier layer 21 is fabricated by low temperature plasma enhanced chemical vapor deposition (PECVD) or atomic layer deposition (ALD).

The material of the buffer layer 22 is an inorganic material. The material of the buffer layer 22 may be $SiO_2$, $SiN_x$, or $Al_2O_3$. The preparation method of the buffer layer 22 is the same as the preparation method of the barrier layer 21.

The active array layer 20 includes the active layer for forming the channel 16, the gate insulator layer 23, the first metal layer 24, the interlayer insulation layer 25, and the second metal layer 26.

The active layer is made by the oriented crystalline polycrystalline silicon film which is formed by performing the first patterning process on the amorphous silicon film, and then performing the crystallization treatment on the amorphous silicon film. The channel 16 is formed by performing the second patterning process on the oriented crystalline polycrystalline silicon film.

The gate insulator layer 23 and the gate (i.e., a metal gate electrode) formed by patterning the first metal layer 24 are located between the first metal layer 24 and the active layer. The interlayer insulation layer 25 is located on the gate. The second metal layer 26 is located on the interlayer insulation layer 25. The source and the drain (i.e., source/drain metal electrodes) are formed by patterning the second metal layer 26.

The OLED display layer 30 is located on the active array layer 20. The OLED display layer 30 includes OLED units, where the OLED units are electrically connected with the active array layer. Specifically, the OLED unit is connected with the drain of the thin film transistor. The packaging layer 40 is located on the OLED display layer 30.

In the flexible organic light emitting diode display of the present disclosure, since the active layer is made by the oriented crystalline polycrystalline silicon film, the grain boundary density of the LTPS thin film along the TFT channel direction is low. Therefore, the TFT has better electrical properties, and has higher reliability under bending stress, thereby increasing the reliability of the flexible display device under bending stress.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. A manufacturing method of a flexible organic light emitting diode (OLED) display, comprising:
   depositing an amorphous silicon film over a flexible substrate and performing a first patterning process, using a lithography process, on the amorphous silicon film to form a plurality of sub-amorphous silicon films, wherein each of the sub-amorphous silicon films comprises a heat dissipating edge composed of two sets of adjacent first sides and second sides, a length of the first side is less than a length of the second side;
   excimer laser annealing each of the sub-amorphous silicon films to form an oriented crystalline polycrystalline silicon film, wherein the polycrystalline silicon film is crystallized along an extension line of the first side;
   performing a second patterning process on the polycrystalline silicon film to form a channel;
   sequentially forming a gate, a source, and a drain over the channel;
   forming an OLED display layer on the source and the drain; and
   forming a packaging layer on the OLED display layer;
   wherein a lengthwise direction of the channel is parallel with the first side, and a widthwise direction of the channel is parallel with the second side.

2. The manufacturing method of the flexible organic light emitting diode display as claimed in claim 1, wherein the polycrystalline silicon film comprises a plurality of polysilicon grains, a lengthwise direction of the polysilicon grains is the same as the lengthwise direction of the channel, and a widthwise direction of the polysilicon grains is the same as the widthwise direction of the channel.

3. The manufacturing method of the flexible organic light emitting diode display as claimed in claim 1, wherein the step of depositing the amorphous silicon film over the flexible substrate comprises:
   forming a barrier layer on the flexible substrate;
   forming a buffer layer on the barrier layer; and
   depositing the amorphous silicon film on the buffer layer.

4. The manufacturing method of the flexible organic light emitting diode display as claimed in claim 1, wherein the step of sequentially forming the gate over the channel comprises:
   forming a gate insulator layer on the channel; and
   forming a first metal layer on the gate insulator layer, and performing a patterning process on the first metal layer to form the gate.

5. A manufacturing method of a flexible organic light emitting diode display, comprising:
   depositing an amorphous silicon film over a flexible substrate and performing a first patterning process, using a lithography process, on the amorphous silicon film to form a plurality of sub-amorphous silicon films, each of the sub-amorphous silicon films comprises a heat dissipating edge composed of two sets of adjacent first sides and second sides, a length of the first side is less than a length of the second side;
   performing a crystallization treatment on each of the sub-amorphous silicon films to form an oriented crystalline polycrystalline silicon film, wherein the polycrystalline silicon film is crystallized along an extension line of the first side;
   performing a second patterning process on the polycrystalline silicon film to form a channel, wherein a lengthwise direction of the channel is parallel with the first side, and a widthwise direction of the channel is parallel with the second side;
   sequentially forming a gate, a source, and a drain over the channel;
   forming an OLED display layer on the source and the drain; and
   forming a packaging layer on the OLED display layer.

6. The manufacturing method of the flexible organic light emitting diode display as claimed in claim 5, wherein the polycrystalline silicon film comprises a plurality of polysilicon grains, a lengthwise direction of the polysilicon grains is the same as the lengthwise direction of the channel, and a widthwise direction of the polysilicon grains is the same as the widthwise direction of the channel.

7. The manufacturing method of the flexible organic light emitting diode display as claimed in claim 5, wherein the step of depositing the amorphous silicon film over the flexible substrate comprises:
   forming a barrier layer on the flexible substrate;
   forming a buffer layer on the barrier layer; and
   depositing the amorphous silicon film on the buffer layer.

8. The manufacturing method of the flexible organic light emitting diode display as claimed in claim 7, wherein a material of the buffer layer comprises $SiO_2$, $SiN_x$, or $Al_2O_3$.

9. The manufacturing method of the flexible organic light emitting diode display as claimed in claim 5, wherein the step of sequentially forming the gate over the channel comprises:
   forming a gate insulator layer on the channel; and
   forming a first metal layer on the gate insulator layer, and performing a patterning process on the first metal layer to form the gate.

* * * * *